United States Patent
Kreuter et al.

(10) Patent No.: US 10,347,792 B2
(45) Date of Patent: Jul. 9, 2019

(54) OPTOELECTRONIC COMPONENT

(71) Applicant: OSRAM Opto Semiconductors GmbH, Regensburg (DE)

(72) Inventors: Philipp Kreuter, Regensburg (DE); Tansen Varghese, Regensburg (DE); Wolfgang Schmid, Regensburg (DE); Markus Bröll, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 15/743,237

(22) PCT Filed: Jul. 7, 2016

(86) PCT No.: PCT/EP2016/066165
§ 371 (c)(1),
(2) Date: Jan. 9, 2018

(87) PCT Pub. No.: WO2017/005866
PCT Pub. Date: Jan. 12, 2017

(65) Prior Publication Data
US 2019/0131495 A1    May 2, 2019

(30) Foreign Application Priority Data
Jul. 9, 2015  (DE) .......................... 10 2015 111 130

(51) Int. Cl.
*H01L 33/00* (2010.01)
*H01L 33/38* (2010.01)
(Continued)

(52) U.S. Cl.
CPC ...... *H01L 33/382* (2013.01); *H01L 31/02161* (2013.01); *H01L 31/02327* (2013.01);
(Continued)

(58) Field of Classification Search
CPC .......... H01L 33/08; H01L 33/14; H01L 33/62
See application file for complete search history.

(56) References Cited

U.S. PATENT DOCUMENTS 6,495,862 B1    12/2002  Okazaki et al.
8,450,751 B2     5/2013  Engl et al.
(Continued)

FOREIGN PATENT DOCUMENTS

DE        102007022947 A1    10/2008

*Primary Examiner* — Thomas L Dickey
(74) *Attorney, Agent, or Firm* — Slater Matsil, LLP

(57) ABSTRACT

An optoelectronic component is disclosed. In an embodiment the component includes a semiconductor layer sequence with a first layer, a second layer and an active layer arranged between the first and second layer, wherein the active layer directly borders the first and second layer, a radiation surface directly bordering the second layer, one or more contact isles for electrically contacting the first layer and one or more through-connections for electrically contacting of the second layer, wherein the through-connections are formed through the first layer and the active layer and open into the second layer, wherein the contact isles are located laterally next to one another directly on a rear side of the first layer facing away from the radiation surface, wherein the through-connections are arranged in regions between the contact isles in a top view of the rear side.

15 Claims, 2 Drawing Sheets

(51) Int. Cl.
  *H01L 33/06* (2010.01)
  *H01L 33/10* (2010.01)
  *H01L 33/30* (2010.01)
  *H01L 33/44* (2010.01)
  *H01L 31/0232* (2014.01)
  *H01L 31/0352* (2006.01)
  *H01L 31/0304* (2006.01)
  *H01L 31/0224* (2006.01)
  *H01L 31/0216* (2014.01)
  *H01L 33/58* (2010.01)

(52) U.S. Cl.
  CPC ........... *H01L 31/022408* (2013.01); *H01L 31/03046* (2013.01); *H01L 31/035218* (2013.01); *H01L 31/035236* (2013.01); *H01L 33/06* (2013.01); *H01L 33/105* (2013.01); *H01L 33/30* (2013.01); *H01L 33/44* (2013.01); *H01L 33/58* (2013.01)

(56) References Cited

U.S. PATENT DOCUMENTS

| | | | | |
|---|---|---|---|---|
| 2011/0049555 | A1* | 3/2011 | Engl | H01L 33/382 257/98 |
| 2011/0272719 | A1* | 11/2011 | Chen | H01L 33/04 257/94 |
| 2013/0285075 | A1* | 10/2013 | Chen | H01L 25/0753 257/88 |
| 2014/0117402 | A1 | 5/2014 | Wang et al. | |
| 2015/0108492 | A1 | 4/2015 | Kuo | |

* cited by examiner

OPTOELECTRONIC COMPONENT

This patent application is a national phase filing under section 371 of PCT/EP2016/066165, filed Jul. 7, 2016, which claims the priority of German patent application 10 2015 111 130.6, filed Jul. 9, 2015, each of which is incorporated herein by reference in its entirety.

TECHNICAL FIELD

An optoelectronic component is provided.

SUMMARY OF THE INVENTION

Embodiments provide an optoelectronic component with a high quantum efficiency.

According to at least one embodiment, the optoelectronic component comprises a semiconductor layer sequence with a first layer, a second layer and an active layer arranged between the first and the second layer. Here, the active layer directly borders the first layer and the second layer. In particular, the mentioned layers are semiconductor layers.

The first layer and/or the second layer and/or the active layer can be individual layers, respectively. Alternatively, each of these layers can itself be composed of a plurality of individual layers.

The semiconductor layer sequence is based on a III-V semiconductor compound material. The semiconductor compound material is a nitride semiconductor compound material, such as $Al_nIn_{1-n-m}Ga_mN$, or a phosphide semiconductor compound material, such as $Al_nIn_{1-n-m}Ga_mP$, or also an arsenide compound semiconductor material, such as $Al_nIn_{1-n-m}Ga_mAs$, with $0 \leq n \leq 1$, $0 \leq m \leq 1$ and $n+m \leq 1$. In this case, the semiconductor layer sequence can comprise dopants as well as additional constituents. For the sake of simplicity, only the essential constituents of the crystal lattice of the semiconductor layer sequence, i.e., Al, As, Ga, In, N or P are named, even if these can partly be substituted and/or added with small amounts of other substances. The semiconductor layer sequence is preferably based on AlInGaPAs.

The active layer comprises at least one p-n junction and/or quantum dots and/or a quantum well structure in the form of a single quantum well, SQW for short, or in the form of a multi quantum well structure, MQW for short. The active layer is, e.g., configured to generate or absorb radiation in the ultraviolet range and/or blue spectral range and/or visible spectral range and/or infrared range.

According to at least one embodiment, the optoelectronic component includes a radiation surface which directly borders the second layer and via which radiation is coupled into or coupled out of the semiconductor layer sequence during operation. In other words, the second layer is arranged between the radiation surface and the active layer. The radiation surface forms a main side of the semiconductor layer sequence. The radiation surface can particularly serve as a radiation exit surface or as a radiation input surface of the optoelectronic component, for example. To enhance efficiency, the radiation surface can be patterned.

According to at least one embodiment, the optoelectronic component includes one or multiple contact isles for electrically contacting the first layer. The in particular electrically-conductive contact isles can comprise or consist of, e.g., a metal or a semiconductor material. Preferably, the contact isles are simply-connected elements, i.e., contiguous elements without apertures or holes. The contact isles can but must not be formed in one piece. For example, the contact isles comprise a core, e.g., a metal core, which is laterally enclosed by another conductive material, e.g., a conductive oxide. Here and in the following, "lateral" refers to a direction parallel to the main extension direction of the active layer.

According to at least one embodiment, the optoelectronic component includes one or multiple trough-connections for electrically contacting of the second layer. Here, the through-connections are formed through the first layer and the active layer, and open into the second layer. Preferably, the through-connections include pins or cores which are configured to conduct current and which are made of a metal or a doped semiconductor material, for example. The through-connections are, e.g., enclosed by an electrically-insulating passivation layer, which prevents a direct electrical contact of the through-connections with the first layer and the active layer. Preferably, the through-connections completely extend through the first layer and the active layer.

According to at least one embodiment, the contact isles are laterally next to one another directly attached on a rear side of the first layer that faces away from the radiation surface. In other words, the contact isles are located opposite the radiation surface. The second layer is arranged between the active layer and the rear side.

According to at least one embodiment, the through-connections are arranged in regions between the contact isles. In other words, the through-connections are in particular not completely enclosed laterally by a contiguous track of a contact isle. In other words, the through-connections do not extend through the contact isles, but are arranged at a distance next to the contact isles.

According to at least one embodiment, each contact isle is laterally completely enclosed by a contiguous track of an electric insulation region. The insulating region spaces and separates each contact isle from the remaining contact isles in the lateral direction. The insulating region is formed, e.g., as a contiguous layer of an electrically-insulating material, wherein the contiguous layer is completely penetrated by the contact isles and through-connections. During the intended operation of the optoelectronic component, preferably no electric charge carries are guided out of or into the semiconductor layer sequence via the insulating region.

According to at least one embodiment, a sheet resistance of the second layer is at most one quarter or one eighth or 1/16 of a sheet resistance of the first layer. Alternatively, or in addition, the second layer has a sheet resistance of at most $1000\Omega/\square$ or $300\Omega/\square$ or $100\Omega/\square$ or $10\Omega/\square$. The symbol Q is unitless and only serves for differentiation from the general ohmic resistance. Here, the sheet resistance is in particular measured for a current flow parallel to the main extension plane of the active layer and is, for example, indicted for a temperature range between $-50°$ C. and $200°$ C. inclusive.

In at least one embodiment, the optoelectronic component comprises a semiconductor layer sequence with a first layer, a second layer and an active layer arranged between the first and second layer, wherein the active layer directly borders the first and second layers. The component further comprises a radiation surface, which directly borders the second layer and via which radiation is coupled into or out of the semiconductor layer sequence during operation. In addition, the component comprises a multitude of contact isles for electrically contacting of the first layer as well as a multitude of through-connections for electrically contacting the second layer. The through-connections are formed through the first layer and the active layer and open into the second layer.

The contact isles are, laterally next to one another, directly attached on a rear side of the first layer facing away from the radiation surface. In a top view of the rear side, the through-connections are arranged in regions between the contact isles. Each contact isle is laterally completely enclosed by an electrically-insulating region and spaced and separated from the remaining contact isles by the electrically-insulating region in the lateral direction. A sheet resistance of the second layer is at most one fourth of a sheet resistance of the first layer.

The invention described here is in particular based upon the knowledge that it is important in light-emitting diodes or photodiodes having through-connections that the current trough the active layer is kept away from the through-connections as far as possible. In fact, surface recombination centers that negatively impact the internal quantum efficiency of the component are formed while etching the through-connections through the active layer on the shell surface of the through-connections. On the other hand, keeping the serial resistance as low as possible in such component is strived for, to maximize high-current efficiency.

In the invention described here, the contact elements for electrically contacting of the first layer are formed as contact isles, which are spaced from the through-connections in the lateral direction. In this way, the main current path through the active layer is guided further away from the trough-connections, thereby suppressing non-radiating recombination. The control of the current paths is improved in that the thickness of the first layer is kept small, such that there is only a small lateral current expansion. In order to nevertheless keep the serial resistance of the component low, the second layer is selected as thick as possible so that the lateral electric resistance is reduced. This can also be influenced by an appropriate selection of the electrical conductivity of the second layer.

According to at least one embodiment, the first layer has a sheet resistance of at least 100Ω/☐ or 1,000Ω/☐ or 10,000Ω/☐ or 100,000Ω/☐.

According to at least one embodiment, the first layer has a thickness of at most 1.5 µm or 1 µm or 500 nm or 300 nm. Alternatively or in addition, the thickness of the first layer is at least 50 nm or 100 nm or 200 nm.

According to at least one embodiment, the second layer has a thickness of at least 1.5 µm or 3 µm or 5 µm. Alternatively or in addition, the thickness of the second layer is at most 20 µm or 12 µm or 6 µm.

Here, the thickness of a layer refers to the thickness averaged along the total lateral extension, or the maximum measured thickness or the minimum measured thickness.

According to at least one embodiment, the contact isles are electrically-conductively connected to one another via a contiguous distribution layer. The distribution layer is an electrically-conductive layer, for example, a contiguous layer that extends over all contact isles. Preferably, the distribution layer not only serves to laterally distribute current, but at the same time as a mirror layer for reflecting radiation back in the direction of the radiation surface or the active layer. Here, the distribution layer preferably extends along the entire lateral extension of the active layer.

The distribution layer and/or the contacts isles can comprise or consist of one or more of the following metals: Ag, Au, Al, Ti, Sn, Pt, Pd, Rh.

The insulating region is, e.g., arranged or enclosed between the semiconductor layer sequence and the distribution layer. Preferably, the insulating region also directly borders the distribution layer. The insulating region can, e.g., comprise or consist of a dielectric. The insulating region, e.g., comprises or consists of silicon oxide, such as $SiO_2$, or silicon nitride, such as SiN, or alumina, such as $Al_2O_3$. Preferably, the insulating region and the distribution layer together form a dielectric mirror for the electromagnetic radiation emitted by the active layer or for the electromagnetic radiation entering through the radiation surface.

According to at least one embodiment, the insulating region directly borders the contact isles and the first layer. In particular, the regions between the contact isles are filled with the insulating region.

According to at least one embodiment, the lateral distance between each through-connection and the nearest contact isle is at least $0.5 \cdot n/n_{amb}$ times or at least $n/n_{amb}$ times or at least $2 \cdot n/n_{amb}$ times or at least $3 \cdot n/n_{amb}$ times the half lateral extension of the contact isle, wherein n is the refractive index of the first or the second layer or a refractive index averaged over the semiconductor layer sequence, and $n_{amb}$ is the refractive index of a material bordering the radiation surface. For example, this material is the material of a lens covering the radiation surface or an encapsulation, such as a silicone encapsulation, or a surrounding material, such as air. The material preferably covers the radiation surface in a form-fit manner.

Alternatively or in addition, the lateral distance between each through-connection and the nearest contact isle is at least 15 µm or 30 µm or 60 µm. Alternatively or in addition, the distance is at most 100 µm or 80 µm or 50 µm. This achieves that the current paths are lead away from the through-connections as far as possible.

According to at least one embodiment, the radiation surface comprises structures in the form of micro-lenses. To that end, the second layer can be structured accordingly, for example, by means of an etching process. Alternatively, it is also possible for the second layer to have micro-lenses attached thereon that are made of a material other than that of the second layer. The micro-lenses can be formed from a transparent material, such as silicon dioxide or a photoresist, for example.

For example, the material bordering the radiation surface and having the refractive index $n_{amb}$ also borders the micro-lenses and differs from the material of the micro-lenses. The micro-lenses are covered by this material then, for example, in a form-fit manner.

Preferably, the micro-lenses have larger lateral extensions, e.g., lateral extensions larger than the contact isles by at least 10%, 50% or 100%. Each micro-lens has a lateral and/or vertical extension of at least 1 µm or 2 µm or 5 µm or 10 µm and/or of at most 50 µm or 25 µm or 10 µm, for example. Here, "vertical" refers to a direction perpendicular to the lateral direction.

According to at least one embodiment, a micro-lens is located opposite each contact isle. In particular, there is a distinct, unambiguously assigned micro-lens for each contact isle. In a plan view of the radiation surface, each contact isle partially or completely overlaps with a micro-lens, in particular. In a top view, for example, each contact isle is completely covered by the assigned micro-lens.

Due to the direct arrangement of the contact isles on the rear side and due to the thin first layer, radiation is only generated within the active layer in the region in direct vicinity of the respective contact isle. The unambiguous assignment of the micro-lenses to the contact isles results in that this generated radiation is efficiently and/or particularly well-directed decoupled from the optoelectronic component.

The micro-lenses are preferably convex lenses with outer surfaces curved to the outside. The micro-lenses are, e.g., spherical or aspherical lenses, for example, Fresnel lenses. The micro-lenses might also be formed as photonic crystals. The emission surface is in particular covered with micro-lenses over the entire surface thereof. Preferably, the micro-lenses are arranged on the emission surface in a monolayer, in a densest sphere packing.

According to at least one embodiment, the active layer has a thickness of at most 600 nm or 300 nm or 200 nm or 100 nm. Selecting a thin active layer and a thin first layer may enhance the so-called Purcell effect within the component.

According to the Purcell effect, the proportion of spontaneous emission can be increased in that the emitting region is located in a resonator. In a component as described here, the radiation generated in the active layer can be emitted in the direction of the rear side of the first layer and, partially or completely, be reflected. The incoming and reflecting waves can interfere with one another, thereby forming interference maxima and interference minima, wherein the intensity of the interference maxima decreases in the direction away from the rear side.

If the active layer is now placed particularly close to the rear side, the first and strongest interference maximum may occur directly in the active layer, thereby causing an increased probability of spontaneous emission and thus of increased quantum efficiency due to the Purcell effect.

According to at least one embodiment, the active layer comprises a quantum dot structure or a quantum well structure with an alternating arrangement of quantum wells and barriers. The number of quantum wells in the active layer is, e.g., at most 20 or at most 10 or at most 6 or at most 4 or at most 3.

According to at least one embodiment, the first layer comprises a barrier layer bordering the active layer. Here, the barrier layer has an increased conduction band level and/or a decreased valence band level compared to the remainder of the first layer. Typically, such a barrier layer is used to keep a leakage current through the active layer low. If the second layer is, for example, a n-conductive layer, it is possible for the electrons to flow over the active layer, without recombining with holes within the active layer. This leads to a reduction in the quantum efficiency. A barrier layer, which is arranged in the first layer and has an increased conduction band level, can form a reflecting barrier for these electrons, thereby increasing the recombination probability within the active layer. In the case that the second layer is a p-conducting layer, the barrier layer is preferably formed with a lowered valence band level.

According to at least one embodiment, the barrier layer has a conduction band level increased by at least 20 meV or 100 meV or 200 meV and/or a valence band level decreased by at least 20 meV or 100 meV or 200 meV compared to the second layer in the non-energized state of the optoelectronic component. Whether a higher conduction band level or a lower valence band level is selected depends on the conduction type of the second layer, as described above. As the first layer can be selected to be very thin, the barrier layer must also be selected accordingly thin, which leads to a reduction of the reflective effect of the barrier layer. This can at least partially be compensated in that the barrier height of the barrier layer is selected suitably high.

According to at least one embodiment, the active layer is based on AlInGaAsP. The barrier layer is based on ZnSe or InAlP, for example.

According to at least one embodiment, the micro-lenses and/or contact isles and/or through-connections are arranged in the type of a matrix in a plan view of the radiation surface. The micro-lenses and/or contact isles and/or through-connections occupy all lattice points of a regular lattice. Possible matrix patterns are, e.g., a rectangle pattern or a hexagonal pattern, such as a honeycomb structure.

According to at least one embodiment, the contact isles have lateral extensions of at least 2 µm or 5 µm or 10 µm and/or lateral dimensions of at most 20 µm or 15 µm or 10 µm.

According to at least one embodiment, the distance between directly-neighboring contact isles is at least 5 µm or 15 µm or 30 µm. Alternatively or in addition, the distance is at most 150 µm or 120 µm or 90 µm.

According to at least one embodiment, the through-connections have lateral dimensions of at least 3 µm or 8 µm or 15 µm and/or lateral dimensions of at most 50 m or 30 µm or 15 µm. The distance between the through-connections can have the same values as that for the contact isles.

According to at least one embodiment, the surface coverage density of the through-connections, related to and measured in the active layer, is at least 1% or 5% or 10% and/or at most 70% or 60% or 50%.

According to at least one embodiment, the surface coverage density of the contact isles, related to and measured in the first layer, is at least 3% or 10% or 15% and/or at most 35% or 25% or 20%.

According to at least one embodiment, the first layer is a n-conducting layer and the second layer is a p-conducting layer. Alternatively, the conductivity type of the first and second layer can be reversed.

According to at least one embodiment, the active layer extends contiguously along the entire lateral extension of the optoelectronic component. Due to the through-connections, the active layer is then, in general, not simply-connected, i.e., does have apertures or holes.

According to at least one embodiment, the semiconductor layer sequence is free from a growth substrate of the semiconductor layer sequence. In this case, free can mean that the component still has remainders of a growth substrate, but that these remainders do not have a stabilizing effect for the semiconductor layer sequence. A carrier attached in addition serves to mechanically stabilize the semiconductor layer sequence. The carrier is preferably arranged on the first layer and is mechanically self-supporting. In particular, the component is a thin-film component.

BRIEF DESCRIPTION OF THE DRAWINGS

An optoelectronic component described here is explained by means of exemplary embodiments in more detail below with reference to the drawings. Like reference numerals indicate like elements in the individual figures. However, no relations are illustrated true to scale, and individual elements rather can be illustrated in an exaggerated size for the purpose of a better understanding.

The figures show in.

DETAILED DESCRIPTION OF ILLUSTRATIVE EMBODIMENTS

Figure 1A:
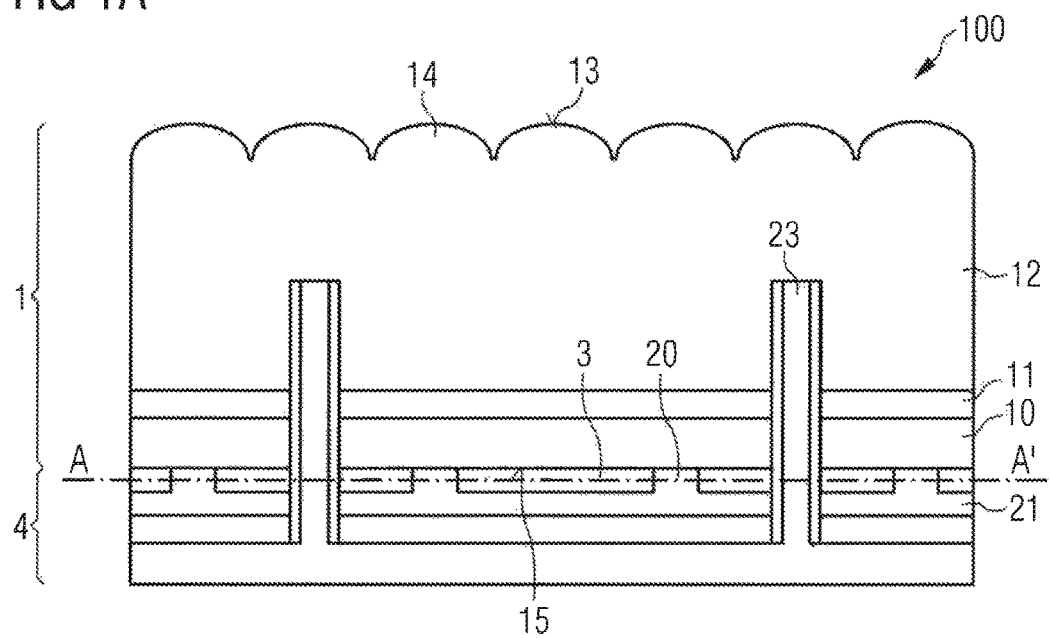
FIG. 1A to 1C are exemplary embodiments of optoelectronic components in a cross-sectional view.

FIG. 1A illustrates an exemplary embodiment of an optoelectronic component 100 in a lateral cross-sectional view. A semiconductor layer sequence 1, which is arranged on a carrier 4, can be discerned. In this case, the carrier 4 is different from a growth substrate of the semiconductor layer sequence 1. The growth substrate of the semiconductor layer sequence 1 is removed, for example. In the present case, the semiconductor layer sequence 1 comprises a first layer 10, an active layer 11 arranged on top of it, and a second layer 12 arranged on top of it. The active layer 11 is in direct contact with the first layer 10 and the second layer 12. The second layer 12 comprises a radiation surface 13 facing away from the active layer 11. The first layer 10 comprises a rear side 15 facing away from the active layer 11. The rear side 15 faces the carrier 4.

The semiconductor layer sequence 1 is based on AlInGa-PAs, for example. The active layer 11 emits electromagnetic radiation in the visible or infrared spectral range during operation, for example. The first layer 10 is, e.g., a p-conducting layer, the second layer 12 is, e.g., an n-conducting layer. However, a reversed conductivity is possible as well.

It can also be discerned here, that contact isles 20, e. g. made of silver, are attached on the rear side 15, which are in direct mechanical and electrical contact with the first layer 10. Here, the contact isles 20 are simply-connected elements without interruptions. Charge carriers can directly be injected into the second layer 10 via the contact isles 20.

An insulating region 3 is arranged between the contact isles 20, wherein each contact isle 20 is laterally completely enclosed by the insulating region 3. Due to the insulating region 3, the contact isles 20 are laterally spaced from one another. The contacts isles 20 and the insulating region 3 further have a distribution layer 21 applied thereon, which connects the contacts isles 20 to one another in an electrically-conductive manner. The insulating region 3 is formed, e.g., of $SiO_2$ or SiN, the distribution layer 21 is, e.g., made of silver.

Furthermore, it can be discerned in FIG. 1A that through-connections 23 are formed through the distribution layer 21, the insulating region 3, the first layer 10 and the active layer 11. The through-connections 23 open into the second layer 12. Charge carriers can be injected into the second layer 12 via the through-connections 23 from a side of the component 100 that faces away from the radiation surface 13. The through-connections 23 in particular comprise a conductive core, which is laterally completely enclosed by a passivation layer in the lateral direction in such a way that charge carriers cannot directly get into the first layer 10 or the active layer 11 from the conductive core.

In FIG. 1A, the radiation surface 13 is provided with a structure in the form of micro-lenses 14. Here, a micro-lens 14 is located opposite of each contact isle 20 and is unambiguously assigned to the respective contact isle 20. The micro-lenses 14 ensure an increase of the optical extraction efficiency or a directed radiation of the radiation generated by the active layer 11.

Figure 1B:
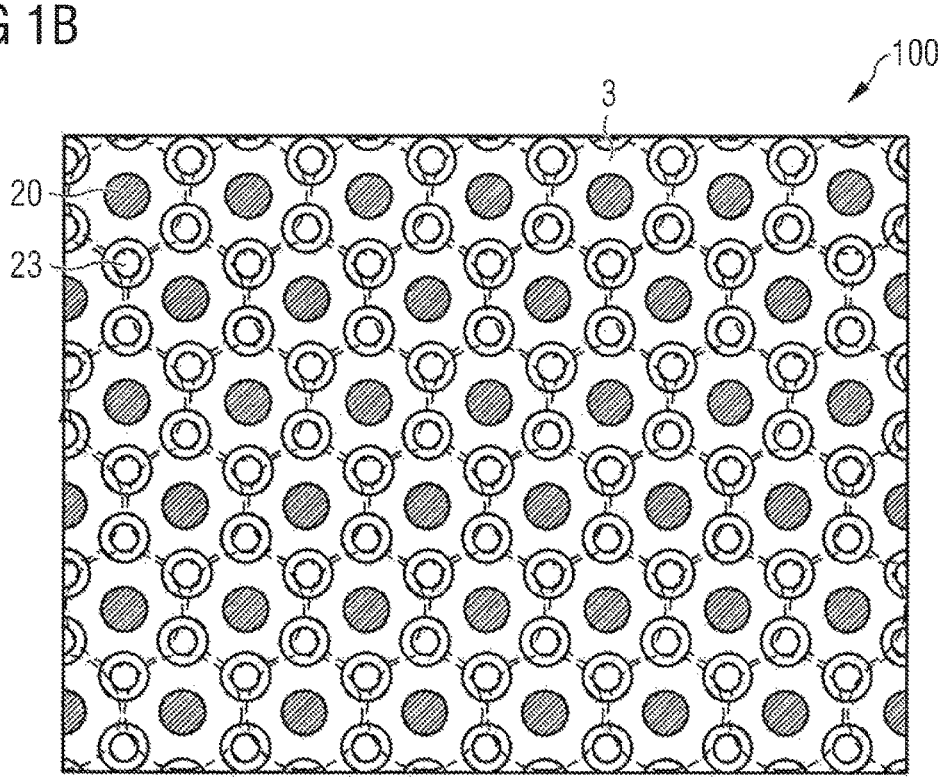

FIG. 1B shows a cross-sectional view of a sectional plane AA' through the insulating region 3 indicated in FIG. 1A. However, in the exemplary embodiment of FIG. 1B, the arrangement of the contact isles 20 and through-connections 23 is different from the exemplary embodiment of FIG. 1A.

It can be discerned in FIG. 1B that the contact isles 20 are arranged in the type of a matrix. In the present case, the matrix pattern is a hexagonal pattern. FIG. 1B further shows the micro-lenses 14 indicated as dashed circles. It can be discerned that each micro-lens 14 completely covers the contact isles 20 associated with it. In particular, the lateral dimensions of the micro-lenses 14 are selected to be greater than the lateral dimensions of the contact isles 20. In a top view of FIG. 1B, each contact isle 20 is completely enclosed by a contiguous track of the insulating region 3. Furthermore, the through-connections 23 are arranged between the contact isles 20. In the present case, each contact isle 20 is surrounded by six through-connections 23, which are, e.g., located on vertexes of a regular hexagon around the respective contact isle 20.

Figure 1C:
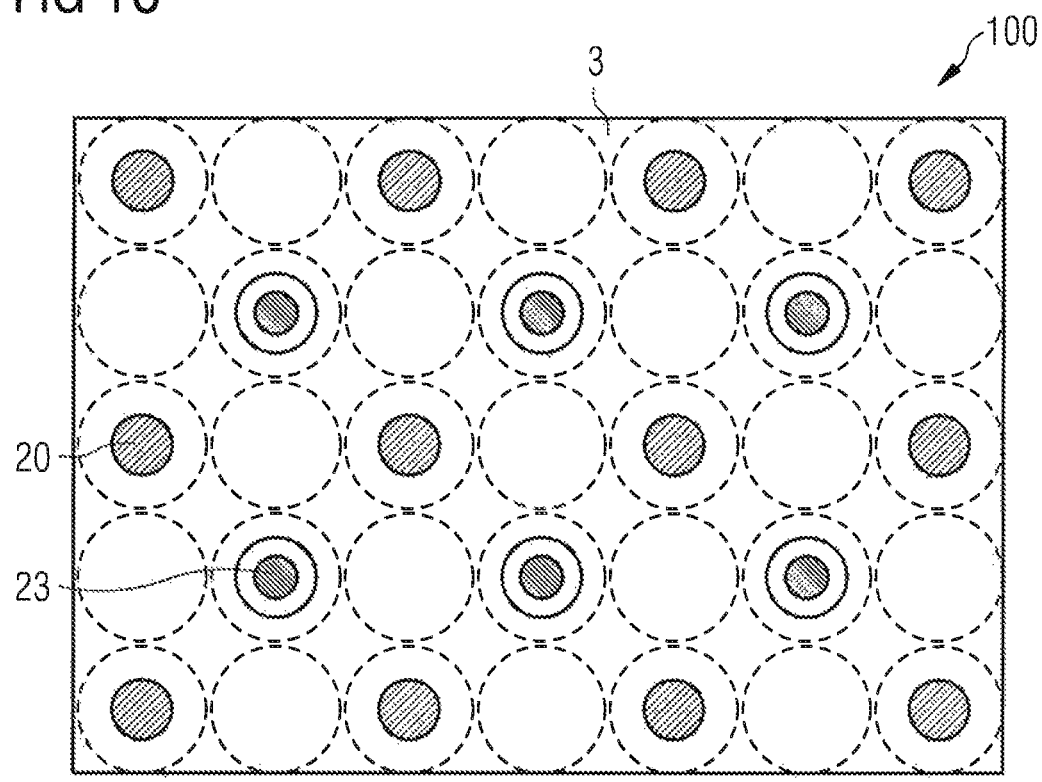

The exemplary embodiment of FIG. 1C shows an alternative to the exemplary embodiment of FIG. 1B. In contrast to FIG. 1B, not every micro-lens 14 has a contact isle 20 assigned to it, but on the other hand, each contact isle 20 has a micro-lens 14 unambiguously assigned to it. The micro-lenses 14, the contact isles 20 as well as the through-connections 23 are arranged on lattice points of a regular rectangular lattice. In each case four contact isles 20 are located on vertexes of a rectangle, in the center of which a through-connection 23 is arranged.

Figure 2:
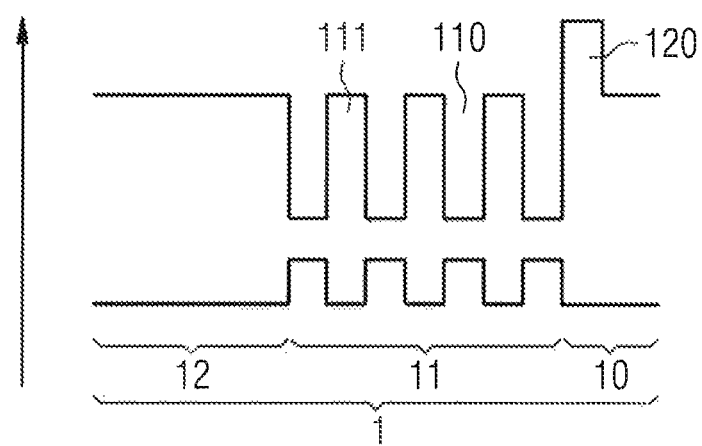
FIG. 2 is an exemplary embodiment of a band structure for an optoelectronic component.

FIG. 2 shows a possible band structure of a semiconductor layer sequence 1 for an optoelectronic component 100 described herein. The energy is plotted on the Y axis and indicated by an arrow. The active layer 11 comprises a quantum well structure having an alternating arrangement of quantum wells 110 and barriers 111. The first layer 10 includes a barrier layer 120 directly bordering the active layer 11, which has an increased conduction band level. The band scheme shown here is to illustrate the distribution of the conduction band level of the semiconductor layer sequence 1 in the non-contacted state. The barrier layer 120 comprises a conduction band level increased by 200 meV with respect to the second layer 12, for example. Electrons migrating from the second layer 12 in the direction of the active layer 11 during operation can be reflected on the barrier layer 120, increasing the recombination probability with holes from the first layer 10 within the active layer 11 as a result. In the present case, the active layer 11 is, for example, based on AlInGaAsP, the barrier layer 120 comprises ZnSe, for example.

The invention is not limited to the exemplary embodiments by the description of these exemplary embodiments. The invention rather comprises any new feature as well as any combination of features, which in particular includes any combination of features in the claims, even if this feature or this combination is per se not explicitly stated in the patent claims or the exemplary embodiments.

The invention claimed is:
1. An optoelectronic component comprising:
a semiconductor layer sequence with a first layer, a second layer and an active layer arranged between the first and second layers, wherein the active layer directly borders the first and second layers;
a radiation surface via which radiation is coupled out of or into the semiconductor layer sequence during operation, wherein the radiation surface directly borders the second layer;
a plurality of contact isles for electrically contacting the first layer; and
one or more through-connections for electrically contacting of the second layer,
wherein the through-connections are formed through the first layer and the active layer and open into the second layer,
wherein the contact isles are located laterally next to one another directly on a rear side of the first layer facing away from the radiation surface,
wherein the through-connections are arranged in regions between the contact isles in a top view of the rear side,
wherein each contact isle is laterally completely surrounded by an electrically-insulating region and spaced and separated from the remaining contact isles in a lateral direction by the electrically-insulating region, and wherein a sheet resistance of the second layer is at most one fourth of a sheet resistance of the first layer.

2. The optoelectronic component according to claim 1, wherein the contact isles are electrically-conductively connected to one another via a contiguous distribution layer, wherein the insulating region is arranged between the semiconductor layer sequence and the distribution layer, and wherein the insulating region directly borders the contact isles and the first layer.

3. The optoelectronic component according to claim 1, wherein a lateral distance between each through-connection and the nearest contact isle is at least $0.5 \cdot n/n_{amb}$-times a half lateral extension of the contact isle, and wherein n is a refractive index of the first layer and $n_{amb}$ is a refractive index of a material bordering the radiation surface.

4. The optoelectronic component according to claim 1, wherein the radiation surface comprises structures in form of micro-lenses, and wherein a micro-lens is located opposite each contact isle such that each contact isle completely or partially overlaps with a micro-lens in a top view of the radiation surface.

5. The optoelectronic component according to claim 1, wherein the first layer has a thickness of at most 1.5 µm, and wherein the second layer has a thickness of at least 1.5 µm.

6. The optoelectronic component according to claim 1, wherein the active layer has a thickness of at most 300 nm during operation, and wherein the first layer has a thickness of at most 300 nm.

7. The optoelectronic component according to claim 1, wherein the active layer has a quantum dot structure or a quantum well structure with an alternating arrangement of quantum wells and barriers.

8. The optoelectronic component according to claim 1, wherein the first layer includes a barrier layer bordering the active layer, and wherein the barrier layer has a conduction band level increased by at least 20 meV and/or a valence band level decreased by at least 20 meV compared to the second layer in a non-energized state of the optoelectronic component.

9. The optoelectronic component according to claim 8, wherein the active layer is based on AlInGaAsP, and wherein the barrier layer is based on ZnSe or InAlP.

10. The optoelectronic component according to claim 4, wherein the micro-lenses, the contact isles and/or the through-connections are arranged in a type of a matrix in a top view of the radiation surface.

11. The optoelectronic component according to claim 1, wherein the contact isles have lateral extensions of between 2 µm and 20 µm inclusive, wherein a distance of directly-adjacent contact isles is between 5 µm and 150 µm inclusive, wherein the through-connections have lateral dimensions of between 3 µm and 50 µm inclusive, wherein a surface coverage density of the through-connections is between 1% and 70% inclusive with respect to and when measured in the active layer, and wherein a surface coverage density of the contact isles is between 3% and 35% inclusive measured and with respect to the first layer.

12. The optoelectronic component according to claim 1, wherein the first layer is an n-conducting layer and the second layer is a p-conducting layer, and wherein the active layer extends contiguously along an entire lateral extension of the optoelectronic component.

13. The optoelectronic component according to claim 1, wherein the semiconductor layer sequence is free of a growth substrate of the semiconductor layer sequence, and wherein the semiconductor layer sequence is mechanically supported and stabilized by a carrier arranged on the first layer.

14. An optoelectronic component comprising:

a semiconductor layer sequence with a first layer, a second layer and an active layer arranged between the first and second layers, wherein the active layer directly borders the first and second layers;

a radiation surface via which radiation is coupled out of or into the semiconductor layer sequence during operation, wherein the radiation surface directly borders the second layer;

one or more contact isles for electrically contacting the first layer; and one or more through-connections for electrically contacting of the second layer, wherein the through-connections are formed through the first layer and the active layer and open into the second layer, wherein the contact isles are located laterally next to one another directly on a rear side of the first layer facing away from the radiation surface, wherein, in a top view of the rear side, the through-connections are arranged in regions between the contact isles, wherein each contact isle is laterally completely surrounded by an electrically-insulating region and spaced and separated from the remaining contact isles in a lateral direction by the electrically-insulating region, wherein a sheet resistance of the second layer is at most one fourth of a sheet resistance of the first layer, wherein the radiation surface comprises structures in form of micro-lenses, and wherein a micro-lens is located opposite each contact isle such that each contact isle completely or partially overlaps with a micro-lens in a top view of the radiation surface.

15. An optoelectronic component comprising:

a semiconductor layer sequence with a first layer, a second layer and an active layer arranged between the first and second layers, wherein the active layer directly borders the first and second layers;

a radiation surface via which radiation is coupled out of or into the semiconductor layer sequence during operation, wherein the radiation surface directly borders the second layer;

one or more contact isles for electrically contacting the first layer; and one or more through-connections for electrically contacting of the second layer, wherein the through-connections are formed through the first layer and the active layer and open into the second layer, wherein the contact isles are located laterally next to one another directly on a rear side of the first layer facing away from the radiation surface, wherein, in a top view of the rear side, the through-connections are arranged in regions between the contact isles, wherein each contact isle is laterally completely surrounded by an electrically-insulating region and spaced and separated from the remaining contact isles in a lateral direction by the electrically-insulating region, wherein a sheet resistance of the second layer is at most one fourth of a sheet resistance of the first layer, wherein a lateral distance between each through-connection and the nearest contact isle is at least $0.5 \cdot n/n_{amb}$-times a half lateral extension of the contact isle, and wherein n is a refractive index of the first layer and $n_{amb}$ is the refractive index of a material bordering the radiation surface.

\* \* \* \* \*